(12) United States Patent
Nakasha et al.

(10) Patent No.: US 7,248,082 B2
(45) Date of Patent: Jul. 24, 2007

(54) SAMPLE-HOLD CIRCUIT

(75) Inventors: Yasuhiro Nakasha, Kawasaki (JP); Tatsuya Hirose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 23 days.

(21) Appl. No.: 11/076,924

(22) Filed: Mar. 11, 2005

(65) Prior Publication Data

US 2006/0114033 A1 Jun. 1, 2006

(30) Foreign Application Priority Data

Nov. 30, 2004 (JP) ............................. 2004-346934

(51) Int. Cl.
*G11C 27/02* (2006.01)
*H03K 5/00* (2006.01)

(52) U.S. Cl. .......................................... 327/91; 327/94

(58) Field of Classification Search ................... 327/91, 327/94, 218, 359, 96
See application file for complete search history.

(56) References Cited

U.S. PATENT DOCUMENTS 5,850,155 A * 12/1998 Matsumoto ................. 326/109
6,433,595 B1 * 8/2002 Tung et al. .................. 327/115
6,798,263 B1 * 9/2004 Leon ........................... 327/203
7,034,594 B2 * 4/2006 Meltzer et al. .............. 327/218
2005/0231258 A1 * 10/2005 Suzuki et al. ................ 327/218

FOREIGN PATENT DOCUMENTS

JP 09-130168 A 5/1997

* cited by examiner

*Primary Examiner*—Quan Tra
*Assistant Examiner*—Rey Aranda
(74) *Attorney, Agent, or Firm*—Arent Fox LLP

(57) ABSTRACT

A sample-hold circuit, which reduces droop and feed through and is suitable for high-speed operation while maintaining a wider freedom of design parameters, comprising a preamplifier to which an input analog signal is applied, a core section which outputs a voltage corresponding to the variation of an output from the preamplifier during the sampling period and holds the voltage corresponding to the output from the preamplifier during the hold period initiated by a transition of a clock signal, and a current switching circuit which is connected to the output pin of the preamplifier and enables the current flowing into the first transistor within the preamplifier during the sampling period to flow into another second transistor to apply a constant potential as an input to the core section.

3 Claims, 10 Drawing Sheets

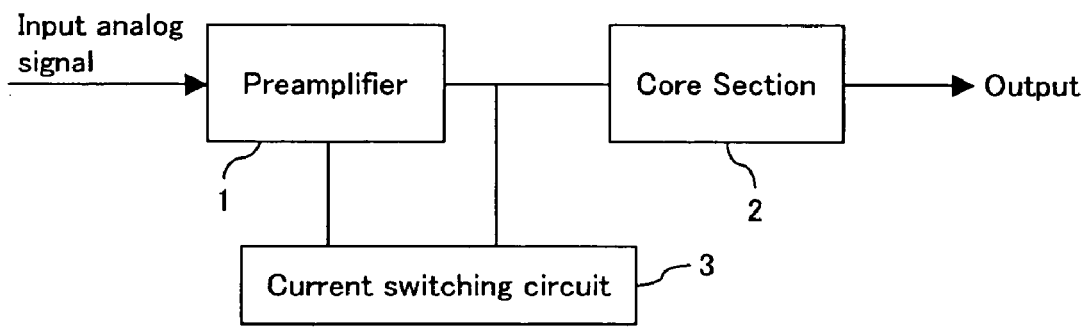
F I G. 4

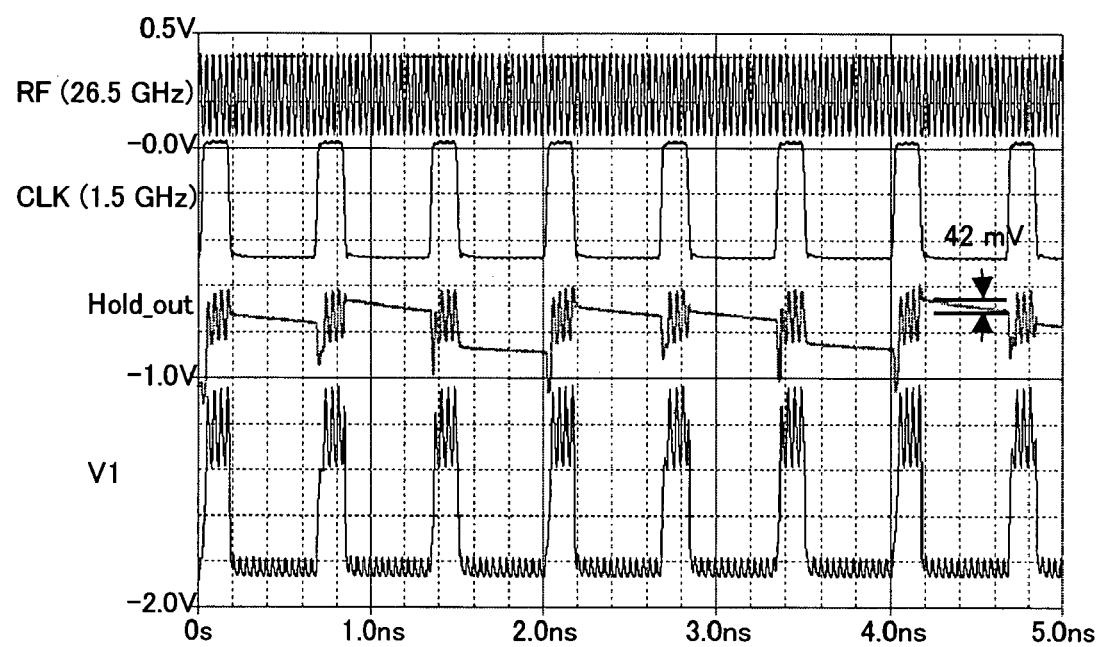
F I G. 8

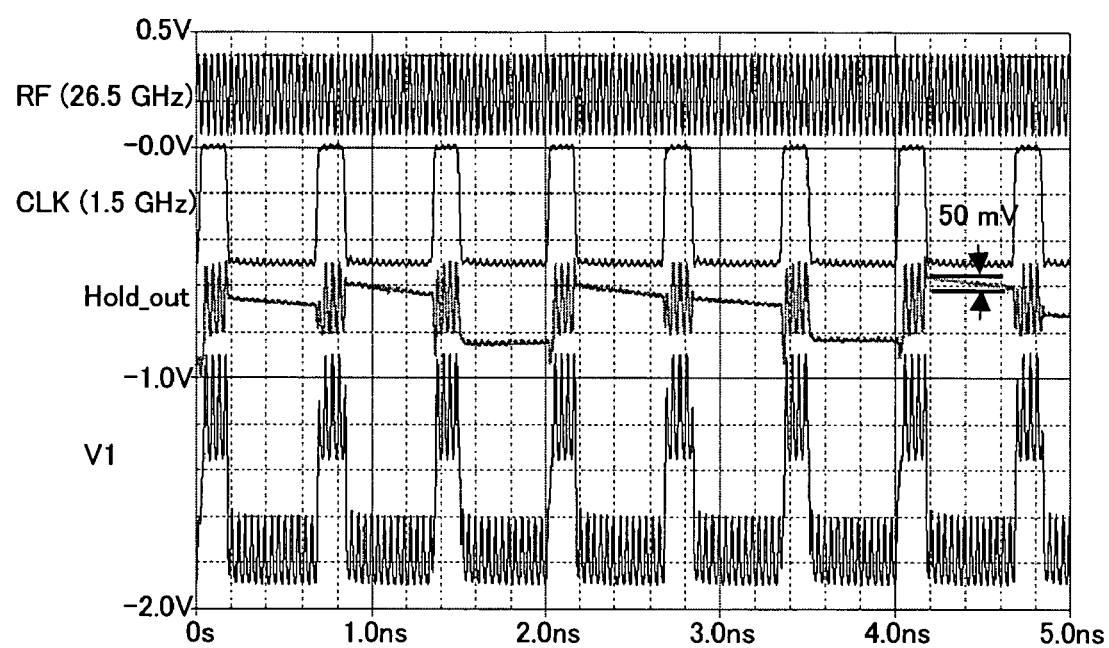
F I G. 9

SAMPLE-HOLD CIRCUIT

CROSS-REFERENCE TO RELATED APPLICATIONS

This application is based upon and claims the benefit of priority from the prior Japanese Patent Application No. 2004-346934 filed on Nov. 30, 2004, the entire contents of which are incorporated herein by reference.

BACKGROUND OF THE INVENTION

1. Field of the Invention

The present invention relates to a sample-hold circuit used, for example, for an analog digital converter or a wireless communication receiving circuit. More specifically, the present invention relates to a current switching source-follower-type sample-hold circuit wherein droop, namely a variation in a hold voltage caused by the leakage current of a transistor, and feed through, namely an influence of an input analog voltage on the hold voltage during a hold period, can be reduced.

2. Description of the Related Art

FIG. 1 is a circuit diagram according to a first example of the prior art of a sample-hold circuit of the current switching source-follower-type. This first example sample-hold circuit is functionally classified into: a preamplifier on the leftmost side, namely, the preamplifier as the section preceding the transistor 23, to the gate of which the potential $V_1$ is applied; a core section of the sample-hold circuit comprising transistors 21 to 24 and a capacitor 25; and an output section comprising transistors 26 and 27.

The preamplifier comprises: transistors 11 and 12, to the gates of which the inverted signal $\overline{RF}$ of a sample signal (input analog signal) RF and the sample signal RF are input respectively; a transistor 13 comprising a current source $I_1$; two resistors 15 and 16 which connect the drain terminals of the transistors 11 and 12 to the potential VDD (GND); and resistors 17 and 18 which connect the source terminals of the transistors 11 and 12 and the drain terminal of the transistor 13. The preamplifier amplifies the sample signal and outputs the amplification result to the core section from the output pin, as the drain terminal, of transistor 11.

The core section comprises: transistors 21 and 22, to the gate terminals of which the sample clock signal CLK and the inverted signal $\overline{CLK}$ are applied respectively; a transistor 23, to the gate terminal of which the output $V_1$ of the preamplifier is applied, which is connected between VDD (GND) and the transistor 21; a transistor 24, which is connected to the source terminals of the transistors 21 and 22 and operates as the current source $I_2$; and a capacitor 25 which is inserted in parallel between the drain and source of the transistors 23.

The sample-hold circuit in its entirety is called a current switching source-follower-type because, in the core section, the current source current $I_2$ is switched and flows between the transistors 21 and 22 according to the value of the clock signal CLK, and the transistors 21 and 23 comprisea source-follower circuit.

During the sampling period wherein the sample clock CLK is "H", the current source current $I_2$ flows through the source-follower circuit, and as a result, the voltage across the capacitor 25 varies according to the value of the sample signal (input analog signal).

In contrast, during the hold period wherein the sample clock CLK is "L", the current source current $I_2$ is switched to the transistor 22-side, and this current flows into the resistor 15, out of the load resistors 15 and 16 of a differential transistor pair, transistors 11 and 12, which comprise the preamplifier. If the value of the resistor 15 is $R_1$, the potential $V_1$ during the hold period is lowered by "$R_1 \times I_2$" from the value immediately before the hold period by increasing the current flowing into the resistor $R_1$ by $I_2$. Thus, the transistor 23 which had been ON up until this point is turned OFF, and as a result, the charge stored in the capacitor 25 is retained and the voltage at both ends thereof is held. The held voltage is applied to an external section as the hold output via the transistor 26.

However, in the first example of the prior art, if the potential of the sample signal, namely the input analog signal, varies during the hold period, this variation affects the gate potential $V_1$ of the transistor 23 via the transistor 11, and if the potential $V_1$ rises, it may cause an increase in the sub-threshold current or cause the transistor to change from OFF to ON in the worst case. The leakage current of the transistor 23 affects the hold voltage, namely, the droop increases due to excessive current flowing into the capacitor 25 from such a rise in the potential $V_1$. In addition, even if the transistor 23 completely maintains the OFF-state, a feed through wherein the sample voltage affects the hold voltage of the capacitor 25 via the gate capacitance of the transistor 23 may occur.

FIG. 2 is an explanatory view of a simulation result, which explains the droop and feed throughf in the first example of the prior art in FIG. 1. In this simulation, the uppermost signal, RF, indicates the sample signal, namely the input analog signal; and the rectangular signal, CLK, directly below indicates the sample clock. The third wave form from the top indicates the hold output. This value corresponds to the sample signal RF while the sample clock CLK is "H". During the hold period, namely when CLK is "L", although the value is ideally held constant at the hold voltage, it tends to drop with time due to the droop. The lowermost waveform indicates the output of the preamplifier in FIG. 1, namely, the potential $V_1$ that is applied to the gate of the transistor 23, and shows that the influence of the sample signal RF is significant even during the hold period.

In FIG. 2, the droop is indicated by the drop in the potential during the hold period. It is shown that if the value of the hold voltage at the falling edge of the clock signal CLK is low, the variation in the hold output is small, and the value of the droop is small. But if the voltage is high, the maximum value of the droop at the time of a high hold voltage is 61 mV. In addition, feed through is indicated by a slight variation in the voltage when the clock signal CLK is "L", or in other words, during the hold period, namely, as a slight oscillation of a frequency equal to that of the sample signal RF.

In addition, in FIG. 2, the sample signal, namely the input analog signal, is shown as a sine wave signal with a constant amplitude of 26.5 GHz, and the sample clock signal is shown as a rectangular wave signal of 1.5 GHz. Although the relation between the frequencies of the signals differs from that between the frequencies of the sample signal and the clock signal of a conventional analog/digital converter or the like, this is a typical relation wherein Ultra Wide Band communication is the field of application. In practice, the sample signal is not a continuous sine wave as shown in FIG. 2, but rather one which accommodates instances wherein a reflected wave is intermittently received even if the frequency is the same, and the voltage hold is performed on the intermittently received reflected wave by using the rising or falling edge of the clock signal.

FIG. 3 is a circuit diagram of a second example of the prior art of a sample-hold circuit. The second example of the prior art is disclosed in the following patent reference.

[Patent Reference 1] Japanese Published Patent application No. 9-130168 "Track/Hold Amplifier"

In the second example of the prior art, in comparison with the first example of the prior art, a transistor 29, which is equivalent to the pull-up circuit of Patent Reference 1 is added. The transistor 29 is intended for turning the transistors 11 and 12 OFF during the hold period, and the potential VBHck is applied to the gate thereof to turn the transistor 29 ON during the hold period. This enables the transistor 11 to be turned OFF during the hold period, thereby suppressing the influence of the variation in the sample signal on the gate potential $V_1$ of the transistor 23, and realizing a reduction of feed through.

However, in the second example of the prior art, although the feed through is suppressed, there exists a problem in that the current source current $I_1$ does not flow into the resistor 15 during the hold period, and compared with the first example of the prior art, the potential $V_1$ during the hold period is increased by $R_1 \times I_1$, and thus the droop aggravated. In order to avoid this situation, it is effective to increase the current source current $I_2$. However, if $I_2$ is increased, the switching characteristics of the transistors 21 and 22, which comprise the differential transistor pair wherein current switching is performed, deteriorate, and power consumption increases. Therefore, there is an additional problem in that design parameters are restricted. Furthermore, although not only the influence of the leakage current of the transistor 23, but also that of the leak current of the transistor 21 which is connected to the capacitor 25 is considered as a cause of the droop, there remains a problem that no countermeasures thereto are taken even in the second example of the prior art.

SUMMARY OF THE INVENTION

The objective of the present invention is to reduce the droop, namely a variation in the hold voltage attributable to the leakage current of the transistor, and the feed through, namely the leakage of the input analog voltage, during the hold period, thereby providing a sample-hold circuit suitable for high speed operation while maintaining a wider freedom of design than that of a prior art circuit, in light of the afore-mentioned problems.

The sample-hold circuit according to the present invention comprises: a core section where the amplified output of the input analog signal by said preamplifier is applied as an input, and a voltage corresponding to the variation in the input analog signal is output during the sampling period, and the value of the voltage corresponding to the amplified output at the time of the transition of the sample clock signal is held and output during the hold period; and a current switching circuit which is connected to the output pin of the preamplifier during the hold period and enables the current which flows into the first transistor, comprised in the preamplifier, during the sampling period, to flow into another second transistor to apply a constant voltage as an input to the core section. This enables reduction in the droop and feed through. In addition, the droop caused by the leakage current of the transistor can be reduced by connecting a diode, which has reverse polarity to that of the hold voltage of the capacitance which holds the voltage within the core section. Furthermore, the droop caused by the leakage current can be further reduced by arranging the differential transistor pair which configures the current switching circuit inside the core section into a two-stage series configuration, thereby realizing a sample-hold circuit which can be operated at high speeds, has high accuracy, and has low-noise characteristics while maintaining a wider freedom of circuit design.

BRIEF DESCRIPTION OF THE DRAWINGS

FIG. 4 is a principle configuration block diagram of the sample-hold circuit according to the present invention;

FIG. 8 is an explanatory view of the simulation result in the first embodiment;

FIG. 9 is an explanatory view of the simulation result in the second embodiment;

DESCRIPTION OF THE PREFERRED EMBODIMENTS

Figure 1:
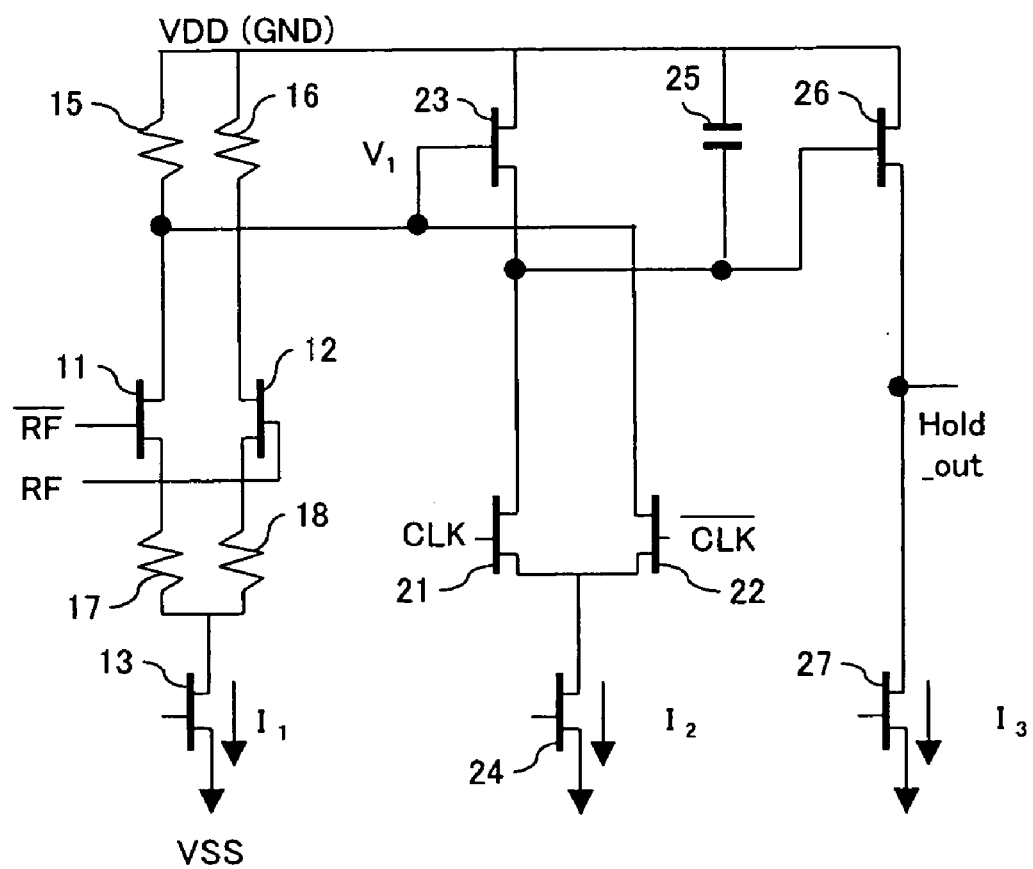
FIG. 1 is a circuit diagram of a first example of the prior art of a sample-hold circuit.

FIG. 4 is the principle configuration block diagram of a sample-hold circuit according to the present invention. This diagram shows the principle configuration of the sample-hold circuit comprising a preamplifier 1 to which the input analog signal is applied and corresponds to a first embodiment of the sample-hold circuit according to the present invention, later described.

In FIG. 4, the amplified output of the input analog signal from the preamplifier 1 is applied as an input to a core section 2 which outputs a voltage corresponding to the variation in the input analog signal during the sampling period, holds the value of the voltage corresponding to the amplified output at the time of transition of the sample clock signal, and outputs the held value during the hold period.

The current switching circuit 3 is connected to the output pin of the preamplifier and enables the current flowing into the first transistor comprised within the preamplifier 1 during the sampling period to flow into a second transistor, applying a constant potential as an input to the core section 2 during the hold period.

In FIG. 4, for example, the inverted signal of the input analog signal is applied to the gate of the first transistor, and this transistor applies the output, of the preamplifier 1, from the drain terminal to the core section 2. The first transistor is turned OFF by switching the current flowing into the first transistor so as to enable the current to flow into the second transistor during the hold period, and as a result, the influence on the hold voltage retained in the core section during the hold period, namely the droop, can be reduced even if the input analog signal varies. In addition, leakage of the input analog signal to the hold voltage, namely feed through, can be reduced.

In this embodiment according to the present invention, the current switching circuit 3 as shown in FIG. 4 comprises a third transistor, which is connected to said first transistor, to the gate terminal of which the sample clock signal is applied, and a fourth transistor which is connected to the second transistor, to the gate terminal of which a DC potential which maintains the transistor in the ON state is applied. This circuit can also apply the inverted signal of the sample clock signal to the gate terminal of the second transistor.

In addition, in this embodiment, the current switching circuit 3 further comprises a fifth transistor, which operates differentially operates with the fourth transistor, to the gate terminal of which a potential which maintains the transistor offset at zero is applied, and in addition, the preamplifier 1 further comprises a sixth transistor which operates differentially with the first transistor and to the gate of which an input analog signal is applied, and can also apply the inverted signal of the input analog signal to the gate terminal of the first transistor.

The sample-hold circuit which partially corresponds to a second embodiment of the sample-hold circuit later described comprises a preamplifier to which the input analog signal is applied and a core section to which the output of the preamplifier is applied, as in FIG. 4. In addition, the core section of the sample-hold circuit is comprised of first and second transistors, which are connected in series and to each gate of which the sample clock signal is applied, and a capacitance which is connected to one of the first and second transistors and holds the value of the voltage corresponding to the output of the preamplifier at the time of the transition of the sample clock signal.

Similarly, another sample-hold circuit, which partially corresponds to the second embodiment, described later, comprises a preamplifier and a core section. The core section comprises a capacitance which holds the value of the voltage corresponding to the output of the preamplifier at the time of the transition of the sample clock signal, a diode which is connected in parallel with the capacitance and has reverse polarity to the polarity of the voltage held, and a transistor which is connected to the junction of the capacitance and the diode, and to the gate of which the sample clock signal is applied.

In this embodiment according to the present invention, the core section of this sample-hold circuit can further comprise a second transistor, to the gate terminal of which the inverted signal of the sample clock signal is applied, which operates differentially with the first transistor, as the afore-mentioned transistor, and is connected to the output of the preamplifier, and a third transistor, to the gate terminal of which the output of the preamplifier is applied, which is connected to the junction of the transistor and the diode.

The second embodiment of the sample-hold circuit comprises the afore-mentioned preamplifier and core section. The core section comprises first and second transistors, to each gate of which the sample clock signal is applied, a capacitance which is connected to one of the first and second transistors and holds the value of the voltage corresponding to the output of the preamplifier at the time of the transition of the sample clock signal, and a diode which is connected to the capacitance in parallel and has reverse polarity to the polarity of the voltage held.

In this embodiment, the sample-hold circuit further comprises third and fourth transistors, to each gate of which the sample clock signal is applied, which operate differentially with the first and second transistors respectively and are connected thereto in series, and a fifth transistor, to the gate of which the output of the preamplifier is applied, which is connected to the junction of a capacitance and one of the first and second transistors. In addition, one of the third and fourth transistors can be also connected to the gate terminal of the fifth transistor.

Thus, in the second embodiment, the diode which has a reverse polarity to the polarity of the hold voltage is connected in parallel to the capacitance which holds the voltage, and in addition, a differential transistor pair which configures the current switching circuit inside the core section, is each arranged in a two-stage series configuration, thereby enabling reduction of the droop caused by leakage current in the transistor which configures the current switching circuit.

A third embodiment of the sample-hold circuit according to the present invention is a combination of the first embodiment and the second embodiment, and comprises a preamplifier 1 to which the input analog signal is applied, a core section 2, and a current switching circuit 3, as in the first embodiment. Furthermore, the core section 2 comprises first and second transistors which are connected in series, to each gate of which the sample clock signal is applied, a capacitance which is connected to one of the first and the second resistors and holds the value of the voltage corresponding to the output of the preamplifier 1 at the time of the transition of the sample clock signal, and a diode which is connected in parallel with the capacitance and has reverse polarity to the polarity of the voltage held.

The sample-hold circuit according to the present invention comprises a current switching circuit, which turns OFF the transistor within the preamplifier, which applies the output of the preamplifier during the hold period, thereby enabling reduction of the droop and feed through. In addition, the diode which has a reverse polarity to that of the hold voltage is connected to the capacitance which holds the voltage inside the core section, thereby enabling reduction of the droop caused by leakage current in the transistor. Furthermore, the differential transistor pair which configures the current switching circuit inside the core section is arranged in a two-stage series configuration, thereby enabling further reduction of the droop caused by leakage current and realization of a sample-hold circuit with high accuracy and low-noise characteristics while maintaining a wider freedom of design.

Figure 5:
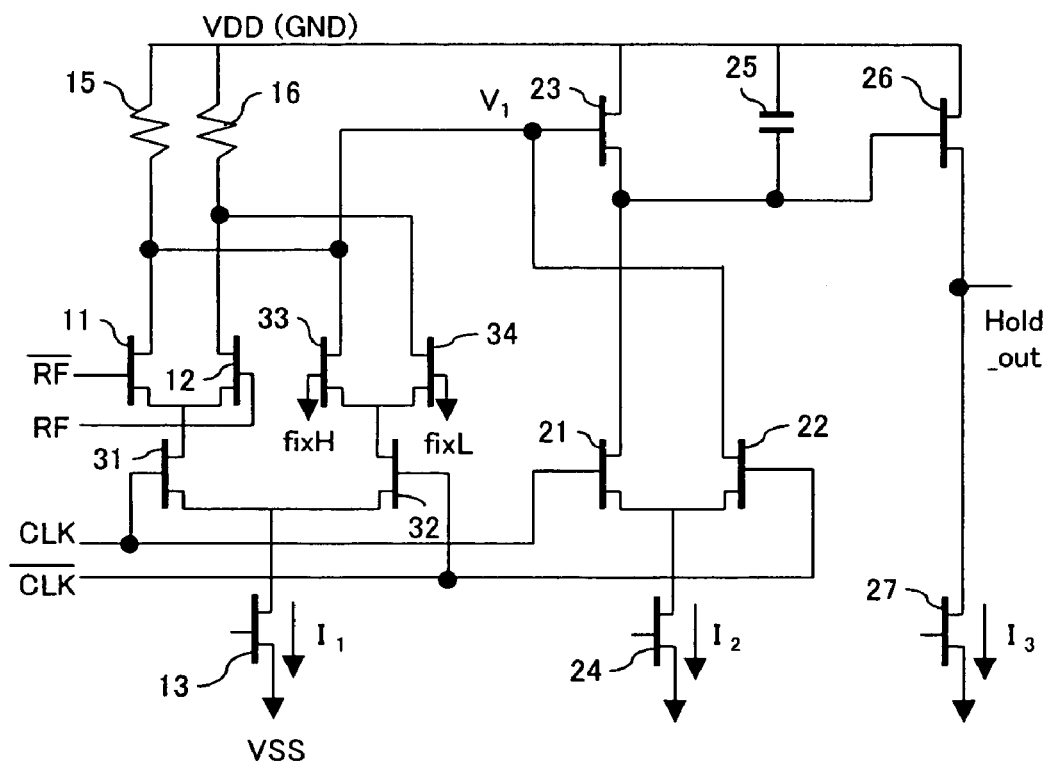
FIG. 5 is a circuit diagram of the sample-hold circuit in a first embodiment.

FIG. 5 is a circuit diagram of the sample-hold circuit in the first embodiment according to the present invention. When comparing the first embodiment with the first example of the prior art, as described in FIG. 1, the basic difference is that four transistors 31 to 34 have been added.

FIG. 5 corresponds to claims 1 to 4 according to the present invention, and the current switching circuit is equivalent to the transistors 31, 32, 33, and 34. In addition, the first transistor is equivalent to the transistor 11, and the second transistor to the transistor 32, the third transistor to the transistor 31, the fourth transistor to the transistor 33, the fifth transistor to the transistor 34, and the sixth transistor to the transistor 12.

The transistors 31 and 32 perform operate as duplicates of the two transistors 21 and 22 in the core section of the sample-hold circuit, and the sample clock signal CLK is applied to the gate of the transistor 31. These transistors enable the current source current $I_1$ to flow into one of the two transistors 11 and 12 comprising the preamplifier in the period where CLK is "H", namely, during the sampling period.

On the other hand, the inverted signal $\overline{CLK}$ of the sample clock is applied to the gate of the transistor 32, and the current source current $I_1$ flows into the resistor 15 via the transistor 33 during the period when the clock is "L" (the hold period). The gate of the transistor 33 is fixed at "H" in DC, and the transistor 33 is always ON. In contrast, the gate of the transistor 34 is fixed at "L" in DC, and the transistor 34 is basically always OFF. However, the transistor 34 is not necessarily limited to OFF in AC, is required to balance the transistor 33 and the transistor 34 in AC.

In other words, the transistors 31 and 32 perform selector operation on the current source current $I_2$ and serve the purpose of enabling $I_1$ to flow in a way that goes through the two transistors 11 and 12, comprising the preamplifier, during the sampling period, and in contrast, enables $I_1$ to flow in a way that goes through the resistor 15 and the transistor 33 during the hold period.

When comparing the first embodiment with the first example of the prior art, although the preamplifier operates as the amplifier circuit for the sample signal (input analog signal) during the sampling period, as in the first example of the prior art, it applies a constant potential which is lower by "$R1 \times (I_1+I_2)$" than VDD (GND), as the gate voltage $V_1$ of the transistor 23 in the core section because the transistors 11 and 12 are completely turned OFF during the hold period.

Therefore, in the first embodiment, since the transistors 11 and 12 are turned OFF during the hold period, the variation in the hold voltage across the capacitor 25 caused by the variation of the potential in the input analog signal, namely, the increase of the droop, the problem of the first example of the prior art, can be prevented. In addition, the leakage of the input analog signal, which is applied to the gate, into the hold output, namely feed through, can be sufficiently reduced.

Figure 6:
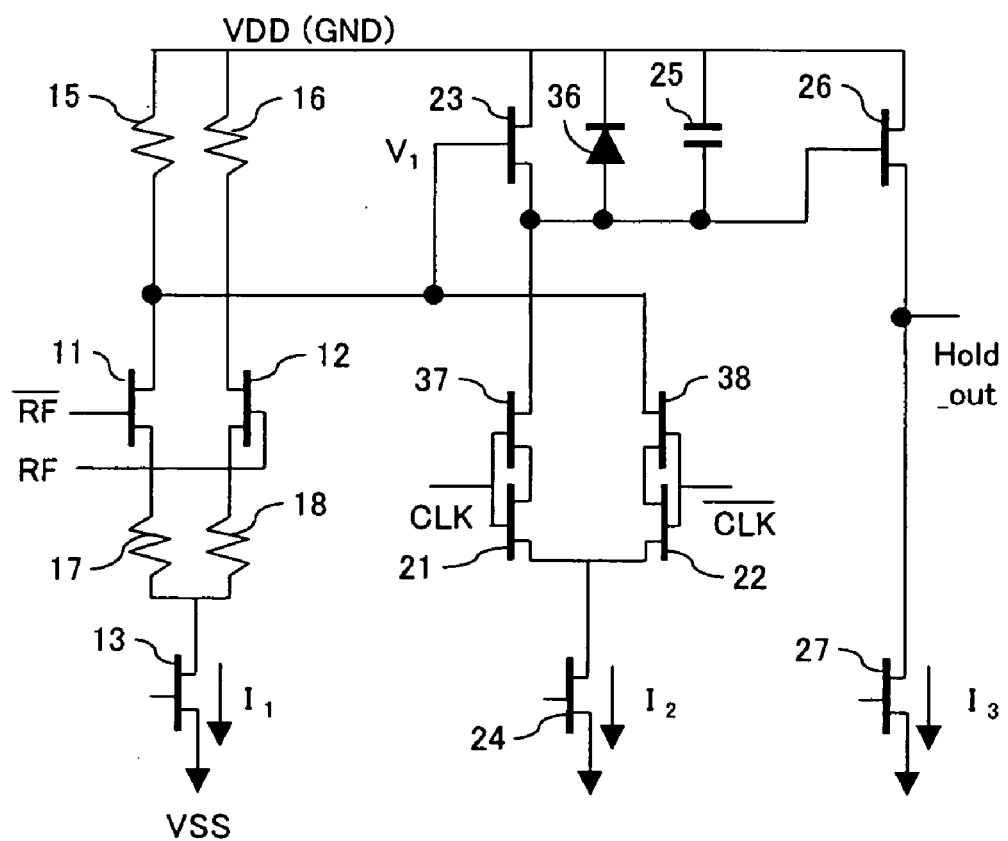
FIG. 6 is a circuit diagram of the sample-hold circuit in a second embodiment.

FIG. 6 is a circuit diagram of the sample-hold circuit of the second embodiment. When comparing this diagram to FIG. 1, the differences are that the diode 36 is connected in parallel with the capacitor 25, and the transistors 37 and 38 are each inserted in series with the transistors 21 and 22 respectively.

FIG. 6 corresponds to claims 5 to 9 according to the present invention, and the first and second transistors in claim 5 are each equivalent to the transistors 21 and 37 respectively. In addition, the transistor in claim 6 and the first transistor in claim 7 are equivalent to the transistor 21, the second transistor is equivalent to the transistor 22, and the third transistor to the transistor 23 if the differential transistor pair comprising the current switching circuit in the core section is of a one-stage configuration. Furthermore, the first and second transistors in claim 8 are each equivalent to the transistors 21 and 37, the third and fourth transistors in claim 9 to the transistors 22 and 38, and the fifth transistor to the transistor 23.

As stated above, other than the leakage current in the transistor 23, namely, the leakage current accompanying the variation in the potential of the input analog signal, the leakage current in the transistor 21 can also cause droop. The problems caused by leakage current in the transistor 23 can basically be solved by blocking the influence of the variation in the potential of the input analog signal on the gate potential of the transistor 23 in the first embodiment. In the second embodiment, the influence of the leakage current in the transistor 21, which is comprised in the current switching circuit in the core section of the sample-hold circuit, is reduced.

The influence of the leakage current of the transistor 21 on the hold voltage, namely on the voltage across the capacitor 25, is reduced by increasing the impedance of the current switching circuit-side as viewed from the capacitor 25, by inserting the transistors 37 and 38. In other words, the influence of the leakage current between the drain sources can be reduced by increasing the impedance.

Figure 3:
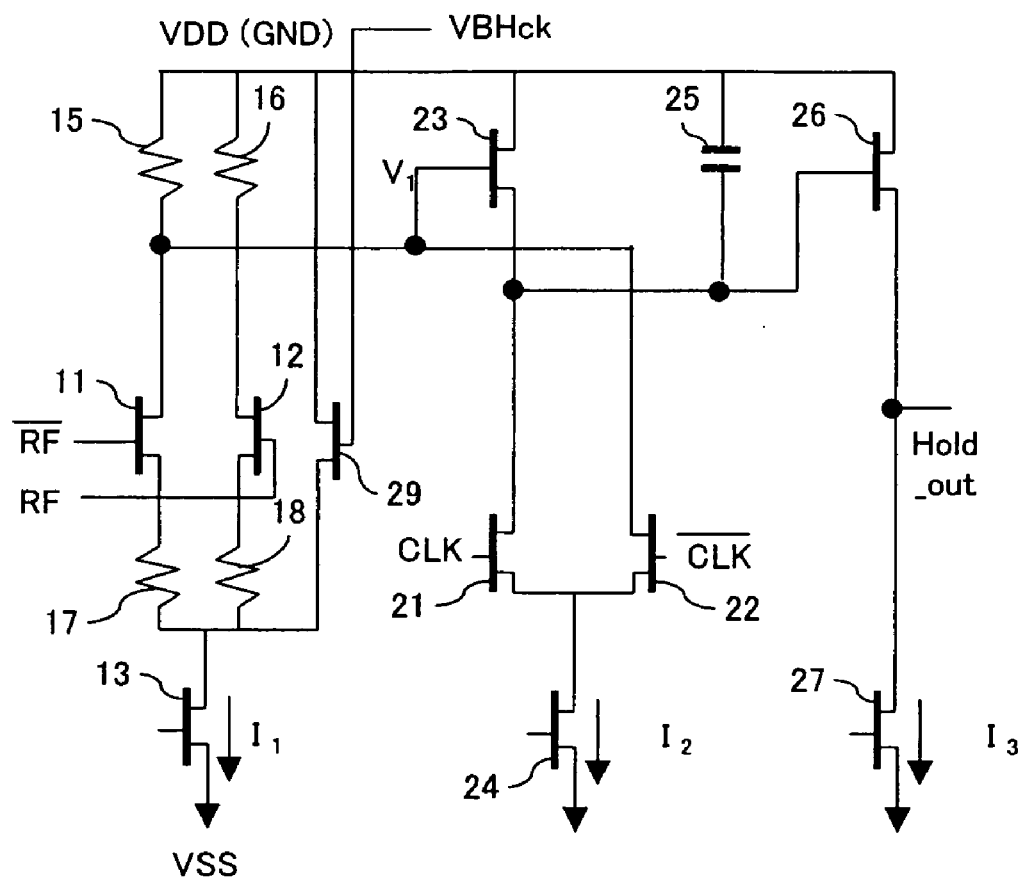
FIG. 3 is a circuit diagram of a second example of the prior art of a sample-hold circuit.

However, it is also necessary to consider the leakage current between the drain and the gate, as the leakage current in the transistor 21. In the circuit shown in FIG. 3, the leakage current between the drain and the gate of the transistor 37 is problematic.

The diode 36, which is connected in parallel with the capacitor 25, compensates for this leakage current between the drain and the gate of the transistor 37, and it is preferable that the diode 36 has the same junction characteristics as that of the drain and the gate of the transistor 37. With such a configuration, the leakage current flowing from the drain to the gate of the transistor 37 can be compensated for by the reverse current of the diode 36, and thus the influence of the leakage current equivalent to the leakage current between the drain and the gate in the transistor 21 on the hold voltage can be reduced. In addition, by using such a diode 36, improvement in the droop can be expected even if the transistors 37 and 38 are not inserted into the circuit in series with transistors 21 and 22.

Figure 7:
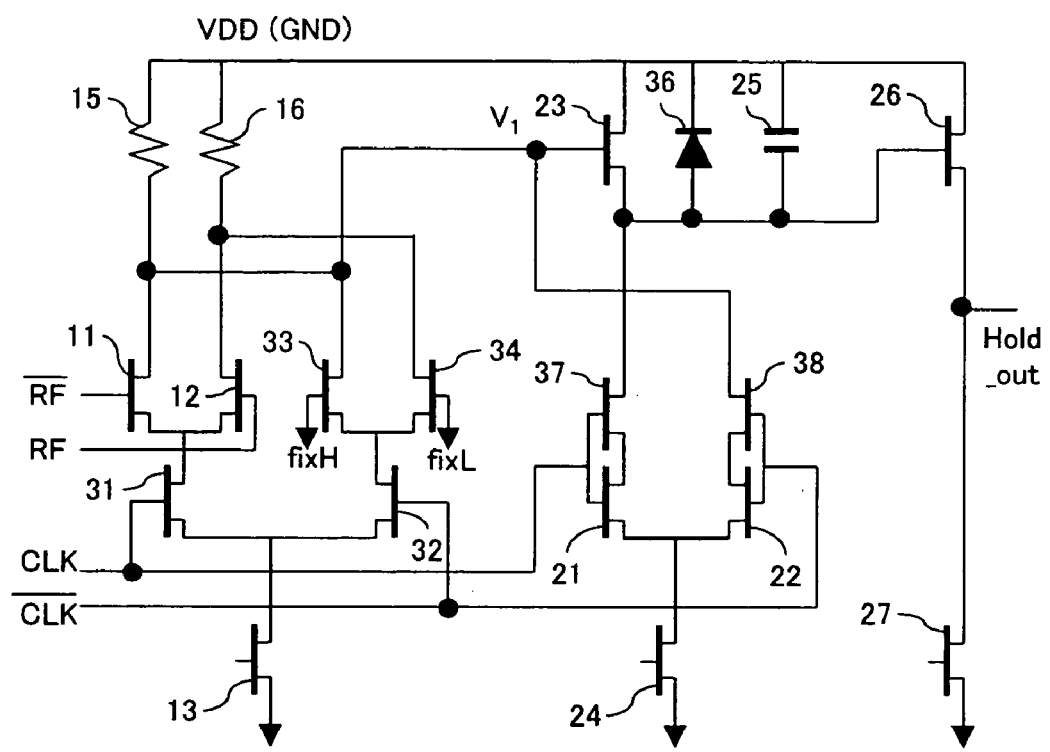
FIG. 7 is a circuit diagram of the sample-hold circuit in a third embodiment.

FIG. 7 is a circuit diagram of the sample-hold circuit in the third embodiment. The third embodiment is a combination of the first embodiment of FIG. 5 and the second embodiment of FIG. 6. The reduction of the droop and the feed through in the first embodiment and the reduction of the droop in the second embodiment can both be expected simultaneously.

Figure 10:
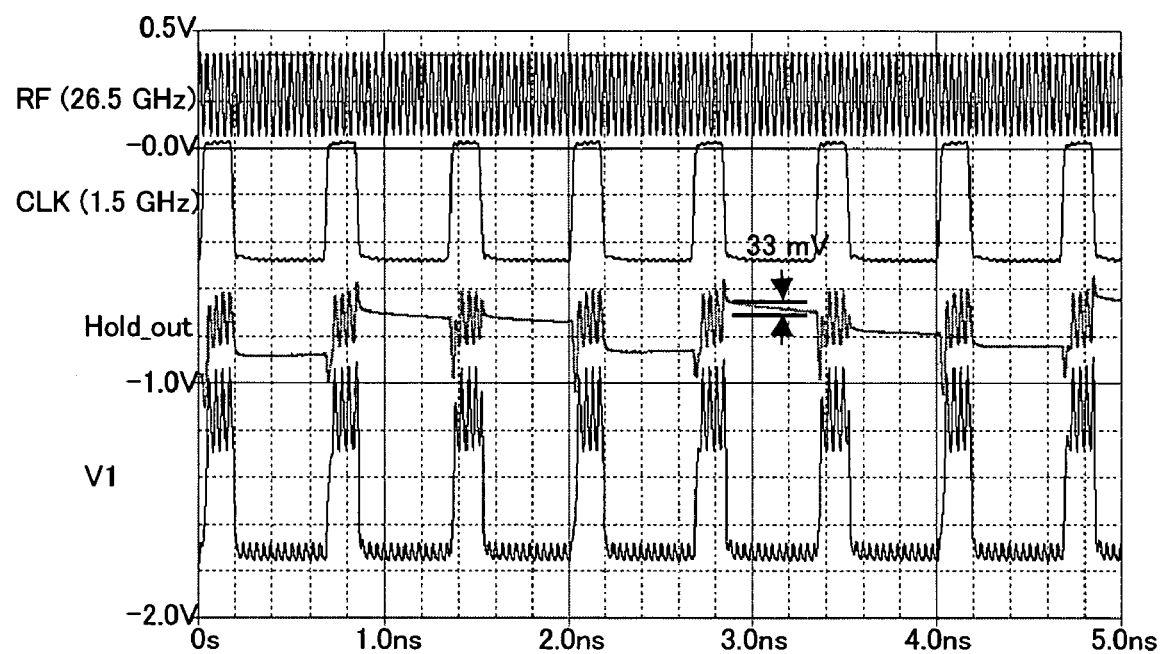
FIG. 10 is an explanatory view of the simulation result in the third embodiment.

FIG. 8 to 10 are explanatory views through simulations of the effects of these three embodiments. FIG. 8 is the simulation result of the first embodiment in FIG. 5, and the variation of the voltage during the hold period, namely the maximum value of the droop, is improved by 19 mV to 42 mV, compared with the 61 mV of FIG. 2.

Figure 2:
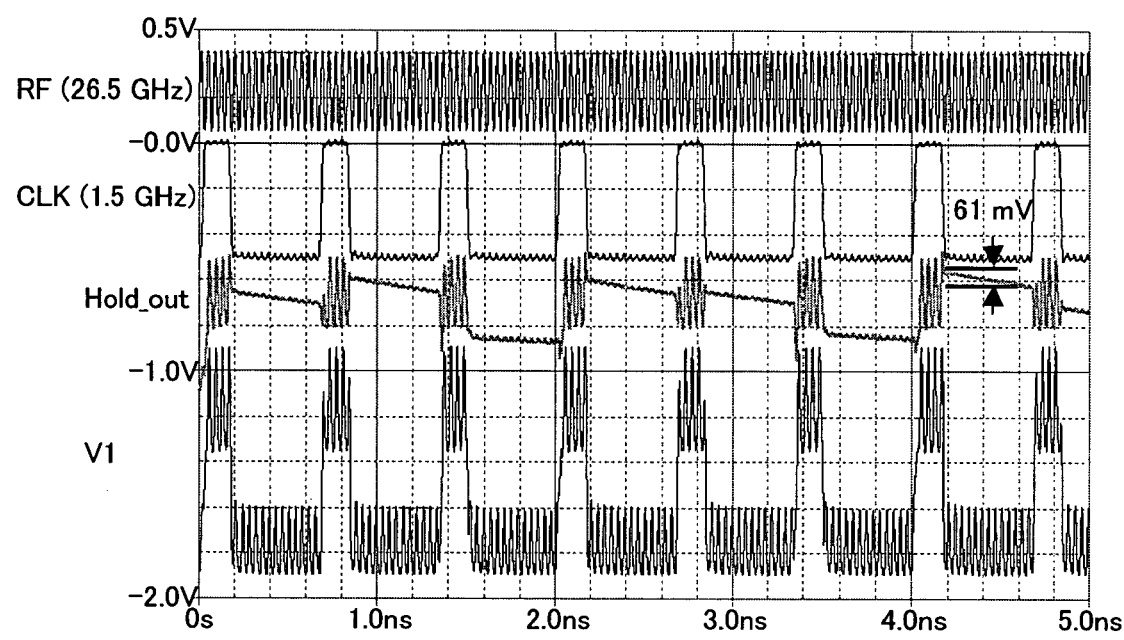
FIG. 2 is an explanatory view of the simulation result of the first example of the prior art.

In addition, the slight variation in the voltage during the hold period, namely, the component having the same frequency as that of input analog signal RF, is barely observed, compared to that in FIG. 2, and thereby, it is understood that feed through has been significantly decreased.

FIG. 9 is the simulation result of the second embodiment in FIG. 6. As stated above, in the second embodiment, the droop caused by the leakage current in the transistor 37 as shown in FIG. 6 is improved, and as a result, the maximum value of the droop is improved by 11 mV, compared to that in FIG. 2. In addition, it can be understood that, in the second embodiment, since the feed through is not improved, the slight oscillation component having the same frequency as that of the RF input signal is superimposed upon the hold voltage.

FIG. 10 is the simulation result of the third embodiment in FIG. 7. The maximum value of the droop is 33 mV, and it can be understood that the droop is improved by 46%, compared to that in FIG. 2. In addition, the improvement effect on the feed through is evident.

What is claimed is:

1. A sample-hold circuit comprising a preamplifier to which an input analog signal is applied, comprising:
  a core section to which the amplified output of the input analog signal by said preamplifier is applied as an input, for outputting a voltage corresponding to the variation in the input analog signal, during the sampling period of the input analog signal, and for holding and outputting the value of the voltage corresponding to the amplified output at the time of the transition of a sample clock signal during the hold period; and
  a current switching circuit which is connected to the output pin of the preamplifier, for enabling a current flowing into a first transistor, comprised within the preamplifier during the sampling period, to flow into a second transistor to apply a constant potential as an input to the core section during the hold period, wherein said current switching circuit comprises:
- a third transistor which is connected to said first transistor and to the gate terminal of which said sample signal is applied;
- a fourth transistor which is connected to said second transistor and to the gate terminal of which a potential, which maintains said transistor ON in DC, is applied; and wherein the inverted signal of said sample clock signal is applied to the gate terminal of said second transistor.

2. A sample-hold circuit according to claim 1, wherein said current switching circuit further comprises a fifth transistor which is a transistor operating differentially with said fourth transistor and to the gate terminal of which a potential always keeping the transistor OFF in DC is applied.

3. A sample-hold circuit comprising a preamplifier to which an input analog signal applied, which comprises:
- a core section to which the amplified output of the input analog signal by the preamplifier is applied as input, during the sampling period of the input analog signal, the voltage corresponding to the variation of the input analog signal, and wherein the value of the voltage corresponding to the amplified output at the time of the transition of a sample clock signal is held and output during the hold period;
- a current switching circuit which is connected to the output terminal of the preamplifier, for enabling the current flowing into the first transistor provided within said preamplifier to flow into another second transistor to apply a constant potential as an input to the core section during the hold period; and
- said core section comprises third and fourth transistors which are connected in series and to each gate of which a sample clock signal is applied;
- a capacitance which is connected to one of the third and fourth transistors, for holding the value of the voltage corresponding to the output of the preamplifier at the time of the variation of the sample clock signal; and
- a diode which is connected to the capacitance in parallel and has a reverse polarity to that of the voltage held.

* * * * *